US012610622B2

(12) United States Patent
Bae et al.

(10) Patent No.: US 12,610,622 B2
(45) Date of Patent: Apr. 21, 2026

(54) DISPLAY APPARATUS AND METHOD OF MANUFACTURING THE DISPLAY APPARATUS

(71) Applicant: SAMSUNG DISPLAY CO., LTD., Yongin-si (KR)

(72) Inventors: Jinhee Bae, Yongin-si (KR); Youngmin Cho, Yongin-si (KR); Heesook Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 407 days.

(21) Appl. No.: 18/116,638

(22) Filed: Mar. 2, 2023

(65) Prior Publication Data

US 2023/0369312 A1 Nov. 16, 2023

(30) Foreign Application Priority Data

May 16, 2022 (KR) ......................... 10-2022-0059836
Jun. 14, 2022 (KR) ......................... 10-2022-0072354

(51) Int. Cl.
*H01L 27/02* (2006.01)
*H10D 89/60* (2025.01)
(Continued)

(52) U.S. Cl.
CPC ......... *H10D 89/60* (2025.01); *H10K 59/1201* (2023.02); *H10K 59/873* (2023.02);
(Continued)

(58) Field of Classification Search
CPC ............. H10K 2102/311; H10K 77/10; H10K 59/131; H10K 59/179; H10K 59/873; H10K 50/844; H10D 89/60
See application file for complete search history.

(56) References Cited

U.S. PATENT DOCUMENTS 9,935,281 B2 * 4/2018 Kim ..................... H10K 59/871
10,054,811 B2 8/2018 Park et al.
(Continued)

FOREIGN PATENT DOCUMENTS

CN 219435462 U * 7/2023 ........... Y02E 10/549
KR 101699405 B1 2/2017
(Continued)

OTHER PUBLICATIONS

Machine translation, Kwon, Korean Pat. Pub. No. KR-1020200033568A, translation date: Aug. 2, 2025, Espacenet, all pages. (Year: 2025).*

(Continued)

*Primary Examiner* — Victoria K. Hall

(74) *Attorney, Agent, or Firm* — CANTOR COLBURN LLP

(57) ABSTRACT

A display apparatus includes a display panel including a display area, an adjacent area surrounding the display area, and a bending area extending from one side of the adjacent area, an optical functional layer disposed on the display panel, a first protective member disposed in the bending area and spaced apart from the optical functional layer in a first direction from the display area toward the bending area, and a second protective member disposed to fill a gap between the optical functional layer and the first protective member, where a modulus of the second protective member is less than a modulus of the first protective member.

26 Claims, 9 Drawing Sheets

(51) Int. Cl.

| | |
|---|---|
| *H10K 59/12* | (2023.01) |
| *H10K 59/80* | (2023.01) |
| *H10K 71/00* | (2023.01) |
| *H10K 77/10* | (2023.01) |
| *H10K 102/00* | (2023.01) |

(52) U.S. Cl.
CPC ............. *H10K 71/00* (2023.02); *H10K 77/10* (2023.02); *H10K 59/8791* (2023.02); *H10K 2102/311* (2023.02)

(56) References Cited

U.S. PATENT DOCUMENTS

| | | | | |
|---|---|---|---|---|
| 10,333,087 | B2 | 6/2019 | Choi et al. | |
| 10,580,850 | B2 | 3/2020 | Lee et al. | |
| 10,840,476 | B2* | 11/2020 | Lee | H10K 59/8722 |
| 11,182,032 | B2* | 11/2021 | Kwon | G06F 3/0445 |
| 11,296,302 | B2* | 4/2022 | Lin | H10K 59/8731 |
| 11,537,243 | B2* | 12/2022 | Son | H10F 39/107 |
| 2016/0093685 | A1* | 3/2016 | Kwon | H10K 59/8791 |
| | | | | 257/40 |
| 2016/0172428 | A1* | 6/2016 | Song | H10K 59/131 |
| | | | | 257/40 |
| 2017/0290106 | A1* | 10/2017 | Kim | H10K 59/871 |
| 2018/0062090 | A1* | 3/2018 | Kim | H10K 50/846 |
| 2018/0097199 | A1* | 4/2018 | Jo | H10K 59/131 |
| 2019/0259965 | A1* | 8/2019 | Jeon | H10K 59/40 |
| 2019/0318689 | A1 | 10/2019 | Kim | |
| 2019/0319215 | A1* | 10/2019 | Lee | H10K 59/8722 |
| 2020/0119291 | A1* | 4/2020 | Jeon | H10K 59/873 |
| 2020/0163243 | A1 | 5/2020 | Shin et al. | |
| 2021/0048918 | A1* | 2/2021 | Son | H05K 1/0281 |
| 2021/0089166 | A1* | 3/2021 | Kwon | G06F 3/0443 |
| 2021/0096668 | A1* | 4/2021 | Kwon | B32B 27/308 |
| 2023/0073412 | A1* | 3/2023 | Lee | B32B 17/06 |
| 2023/0132649 | A1* | 5/2023 | Park | G02B 1/14 |
| | | | | 345/204 |
| 2023/0259171 | A1* | 8/2023 | Kim | G06F 1/1616 |
| | | | | 361/679.01 |
| 2024/0176391 | A1* | 5/2024 | Kishimoto | G06F 1/1652 |

FOREIGN PATENT DOCUMENTS

| | | | | | |
|---|---|---|---|---|---|
| KR | 1020180024418 | A | | 3/2018 | |
| KR | 1020180032719 | A | | 4/2018 | |
| KR | 20190119244 | A | | 10/2019 | |
| KR | 1020190134294 | A | | 12/2019 | |
| KR | 1020200033568 | A | * 3/2020 | | G06F 3/041 |
| KR | 20210086318 | A | | 7/2021 | |
| WO | WO-2019235753 | A1 | * 12/2019 | | G06F 3/041 |

OTHER PUBLICATIONS

Machine translation, Kwon, WIPO Pat. Pub. No. WO-2019235753-A1, translation date: Aug. 2, 2025, Espacenet, all pages. (Year: 2025).*

Machine translation, Lin, Chinese Pat. Pub. No. CN-219435462-U, translation date: Aug. 2, 2025, Espacenet, all pages. (Year: 2025).*

Korean Intellectual Property Office, Request for the Submission of an Opinion, Korea Pat. App. No. 10-2022-0072354, Mar. 13, 2026, all pages. (Year: 2026).*

* cited by examiner

DISPLAY APPARATUS AND METHOD OF MANUFACTURING THE DISPLAY APPARATUS

This application claims priority to Korean Patent Application No. 10-2022-0059836, filed on May 16, 2022, and Korean Patent Application No. 10-2022-0072354, filed on Jun. 14, 2022, and all the benefits accruing therefrom under 35 U.S.C. § 119, the contents of which in their entireties are herein incorporated by reference.

BACKGROUND

1. Field

One or more embodiments relate to a display apparatus and a method of manufacturing the display apparatus, and more particularly, to a display apparatus in which defects in a bending area of a display panel due to an electrostatic discharge (ESD) may be prevented, and a method of manufacturing the display apparatus.

2. Description of the Related Art

Recently, electronic devices have been widely used. Electronic devices are used in various ways such as mobile electronic devices and stationary electronic devices, and such an electronic device typically includes a display apparatus capable of providing a user with visual information such as an image or video to support various functions.

Recently, as the size of components for driving a display apparatus has been reduced, the proportion of the display apparatus in an electronic device has gradually increased, and a structure that may be bent by a certain angle with respect to a flat state or folded around an axis has been developed.

In general, a display apparatus includes a display panel, and the display panel includes a display area that displays an image, and a peripheral area that is a non-display area adjacent to the display area. As at least a portion of the peripheral area of the display panel is bent, visibility at various angles of the display apparatus may be improved, or the area of the non-display area may be reduced.

SUMMARY

In general, an electrostatic discharge (ESD) is generated in a bent area of a display panel and/or an area adjacent to the bent area, and thus, wires of the display panel may be damaged.

One or more embodiments include a display apparatus, in which defects of a display panel may be improved by preventing the occurrence of ESD in the display panel, and a method of manufacturing the display apparatus.

According to one or more embodiments, a display apparatus includes a display panel including a display area, an adjacent area surrounding the display area, and a bending area extending from one side of the adjacent area, an optical functional layer disposed on the display panel, a first protective member disposed in the bending area and spaced apart from the optical functional layer in a first direction from the display area toward the bending area, and a second protective member disposed to fill a gap between the optical functional layer and the first protective member, where a modulus of the second protective member is less than a modulus of the first protective member.

In an embodiment, the modulus of the second protective member may be about 10 megapascals (MPa) or greater and less than about 80 MPa at −20° C.

In an embodiment, the modulus of the second protective member may be greater than about 0 MPa and less than about 1 MPa at 25° C.

In an embodiment, the second protective member may include a resin including silicon (Si).

In an embodiment, a viscosity of the second protective member may be about 50 centipoise (cps) or greater and less than about 1000 cps.

In an embodiment, in a plan view, the second protective member may be in contact with the optical functional layer without overlapping the optical functional layer.

In an embodiment, in a plan view, the second protective member may be in contact with the first protective member without overlapping the first protective member.

In an embodiment, a thickness of the second protective member may be less than a thickness of the optical functional layer.

In an embodiment, the thickness of the second protective member may be ¼ or greater and less than 4/4 of the thickness of the optical functional layer.

In an embodiment, a thickness of the first protective member may be less than a thickness of the optical functional layer.

In an embodiment, in a plan view, a portion of the first protective member may overlap a cover window disposed on the optical functional layer.

In an embodiment, in a plan view, the second protective member may overlap a portion of the first protective member.

In an embodiment, a thickness of the second protective member may be less than a maximum thickness of the first protective member.

In an embodiment, the second protective member may completely cover the first protective member.

In an embodiment, the display apparatus may be foldable around a folding axis extending in a second direction crossing the first direction, the bending area may be spaced apart from the folding axis in the first direction, and, when the display apparatus is folded, the optical functional layer may press the second protective member in the first direction.

According to one or more embodiments, a method of manufacturing a display apparatus includes preparing a display panel including a display area, an adjacent area surrounding the display area, and a bending area extending from one side of the adjacent area, providing an optical functional layer on the display panel, providing a first protective member in the bending area to be spaced apart from the optical functional layer, and providing a second protective member to fill a gap between the optical functional layer and the first protective member, where a modulus of the second protective member is less than a modulus of the first protective member.

In an embodiment, the modulus of the second protective member may be about 10 MPa or greater and less than about 80 MPa at −20° C.

In an embodiment, the modulus of the second protective member may be greater than about 0 MPa and less than about 1 MPa at 25° C.

In an embodiment, the second protective member may include a resin including silicon (Si).

In an embodiment, a viscosity of the second protective member may be about 50 cps or greater and less than about 1000 cps.

In an embodiment, the providing the second protective member may include providing the second protective member by using the optical functional layer as a dam in a way such that the second protective member does not overlap the optical functional layer in a plan view.

In an embodiment, the providing the second protective member may include providing the second protective member to have a thickness that is less than a thickness of the optical functional layer.

In an embodiment, the providing the second protective member may include providing the second protective member to have a thickness that is ¼ or greater and less than 4/4 of the thickness of the optical functional layer.

In an embodiment, the providing the second protective member may include providing the second protective member to completely cover the first protective member.

In an embodiment, the providing the second protective member may include coating the second protective member through a nozzle, and curing the second protective member by radiating ultraviolet rays.

In an embodiment, the providing the first protective member may include coating the first protective member through a nozzle, and curing the first protective member by radiating ultraviolet rays.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
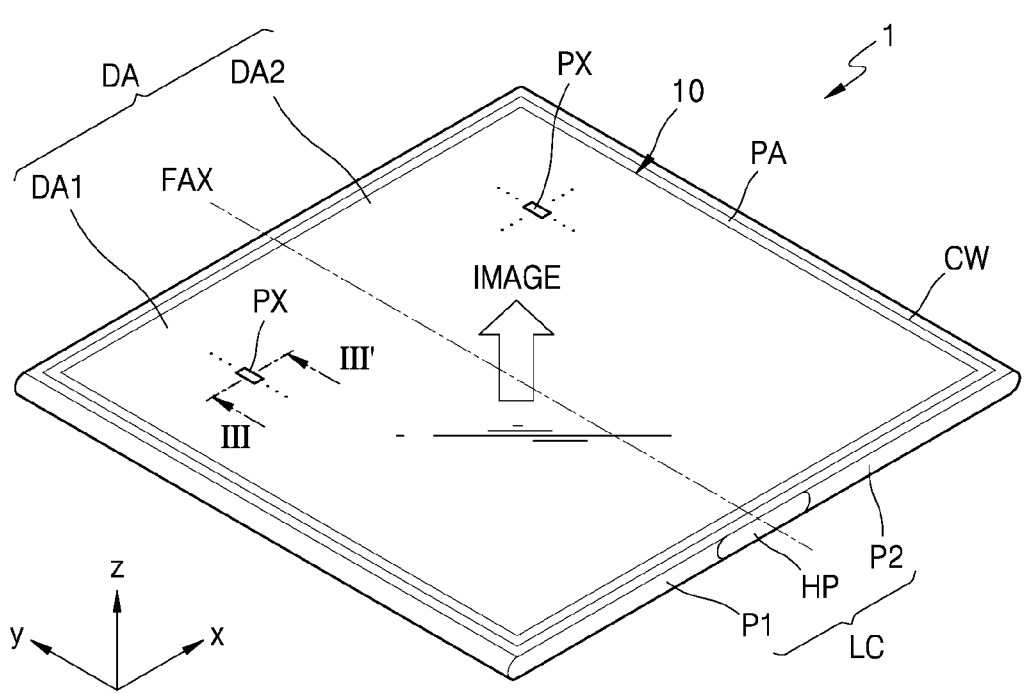
FIGS. 1 and 2 are perspective views each schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Sizes of components in the drawings may be exaggerated for convenience of explanation. In other words, since sizes and thicknesses of components in the drawings are arbitrarily illustrated for convenience of explanation, the following embodiments are not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

When a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described more fully with reference to the accompanying drawings.

Figure 2:
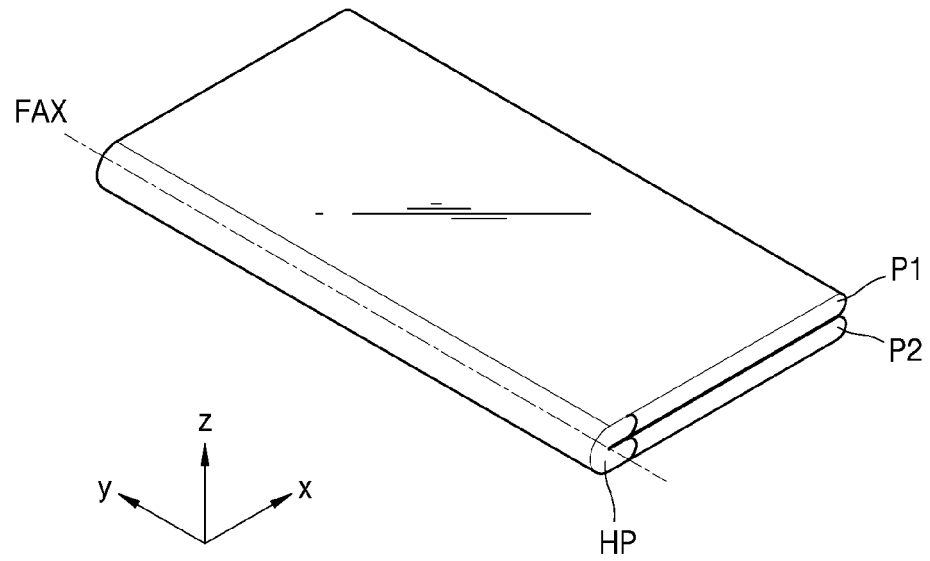

FIGS. 1 and 2 are perspective views each schematically illustrating a display apparatus 1 according to an embodiment. In particular, FIG. 1 illustrates the display apparatus 1 in an unfolded state, and FIG. 2 illustrates the display apparatus 1 in a folded state.

Referring to FIGS. 1 and 2, an embodiment of the display apparatus 1 is an apparatus which displays a video or a still image, which may be a portable electronic device, such as a mobile phone, a smartphone, a table personal computer (PC), a mobile communication terminal, an electronic notebook, an electronic book, a portable multimedia player (PMP), a navigation device, an Ultra Mobile PC (UMPC), or the like, and may also be used as a display screen of various products, such as a television, a laptop computer, a monitor, an advertisement board, an Internet of things (IoT) device, or the like. In addition, an embodiment of the display apparatus 1 may be used as a wearable device, such as a smart watch, a watch phone, a glasses-type display, and a head-mounted display (HMD). In an embodiment, the display apparatus 1 may be used as a dashboard of a vehicle, a center fascia of a vehicle or a center information display (CID) disposed on a dashboard, a room mirror display replacing a side mirror of a vehicle, and a display disposed on a back surface of a front seat as entertainment for a back seat of a vehicle.

The display apparatus 1 may have an approximately rectangular shape in a plan view, as shown in FIG. 1. In an embodiment, for example, as shown in FIG. 1, the display apparatus 1 may have a generally rectangular planar shape having a short side extending in a first direction (e.g., a x direction or −x direction) and a long side extending in a second direction (e.g., a y direction or −y direction). In an embodiment, a portion where the short side extending in the first direction (e.g., the x direction or −x direction) and the long side extending in the second direction (e.g., the y direction or −y direction) meet may have a right-angled shape or a round shape with certain curvature. The planar shape of the display apparatus 1 is not limited to a rectangular shape, and may be other polygonal, elliptical, or irregular shapes.

The display apparatus 1 may include a lower cover LC, a display panel 10, and a cover window CW.

The lower cover LC may form the exterior of a lower surface of the display apparatus 1. The lower cover LC may include plastic, metal, or both plastic and metal. The lower cover LC may include a first portion P1 and a second portion P2, each supporting the display panel 10. The lower cover LC may be folded around a folding axis FAX defined between the first portion P1 and the second portion P2. In an embodiment, the lower cover LC may further include a hinge portion HP, and the hinge portion HP may be provided between the first portion P1 and the second portion P2.

The display panel 10 may include a display area DA and a peripheral area PA. The display area DA may display an image. In an embodiment, a plurality of pixels PX may be arranged in the display area DA. The display panel 10 may provide an image by using light emitted from the plurality of pixels PX. Each of the plurality of pixels PX may emit light by using a display element. In an embodiment, each of the plurality of pixels PX may emit red, green, or blue light. In an embodiment, each of the plurality of pixels PX may emit red, green, blue, or white light.

The peripheral area PA may be a non-display area that does not provide an image. The peripheral area PA may at least partially surround the display area DA. In an embodiment, for example, the peripheral area PA may entirely surround the display area DA. In the peripheral area PA, a driver providing electrical signals to the plurality of pixels PX or a power supply line configured to provide power may be arranged. In an embodiment, for example, a scan driver configured to apply scan signals to the plurality of pixels PX may be arranged in the peripheral area PA. In addition, a data driver configured to apply data signals to the plurality of pixels PX may be arranged in the peripheral area PA.

The display area DA may include a first display area DA1 and a second display area DA2, which are respectively arranged on both sides of the folding axis FAX crossing the display area DA. The first display area DA1 and the second display area DA2 may be on the first portion P1 and the second portion P2 of the lower cover LC, respectively. The display panel 10 may provide a first image and a second image by using light emitted from the plurality of pixels PX arranged in the first display area DA1 and the second display area DA2. In an embodiment, the first image and the second image may be portions of one image provided through the display area DA of the display panel 10. Alternatively, in an embodiment, the display panel 10 may provide a first image and a second image, which are independent of each other.

The display panel 10 may be folded around the folding axis FAX. In an embodiment, when the display panel 10 is folded, the first display area DA1 and the second display area DA2 of the display panel 10 may face each other. In an alternative embodiment, when the display panel 10 is folded, the first display area DA1 and the second display area DA2 of the display panel 10 may face opposite directions.

That is, in an embodiment, the display panel 10 may be in-folded or out-folded around the folding axis FAX. Here, the display panel 10 being in-folded may mean that the display panel 10 is folded around the folding axis FAX in a +z direction, and the display panel 10 being out-folded may mean that the display panel 10 is folded around the folding axis FAX in a −z direction. In other words, in-folding may mean that upper surfaces of the cover window CW disposed on the display panel 10 are folded to face each other, and out-folding may mean that lower surfaces of the cover window CW are folded to face each other. Here, a lower surface of the cover window CW may mean a surface that is closer to a substrate 100 (refer to FIG. 3) than an upper surface of the cover window CW in a z direction.

Although FIGS. 1 and 2 illustrate an embodiment in which the folding axis FAX extends in the second direction (y direction), the disclosure is not limited thereto. In an alternative embodiment, the folding axis FAX may extend in the first direction (x direction) crossing the second direction (y direction). Alternatively, on a xy plane, the folding axis FAX may extend in a direction crossing the first direction (x direction) and the second direction (y direction).

In addition, FIGS. 1 and 2 illustrate an embodiment in which a single folding axis FAX is defined, but the disclosure is not limited thereto. In an embodiment, the display panel 10 may be folded around two folding axes FAX each crossing the display area DA. In an embodiment, for example, when the display panel 10 is folded around two folding axes FAX, the display panel 10 may be in-folded around one folding axis FAX, and may be out-folded around the other folding axis FAX. Alternatively, the display panel 10 may be in-folded or out-folded around both of the two folding axes FAX. In an embodiment, the display panel 10 may be folded around a plurality of folding axes FAX each crossing the display area DA. In such an embodiment, the display panel 10 may be in-folded or out-folded around each of the plurality of folding axes FAX.

The cover window CW may be disposed on the display panel 10 and cover the display panel 10. The cover window CW may be folded by an external force without occurrence of cracks or the like. When the display panel 10 is folded around the folding axis FAX, the cover window CW may also be folded and cover the display panel 10.

Figure 3:
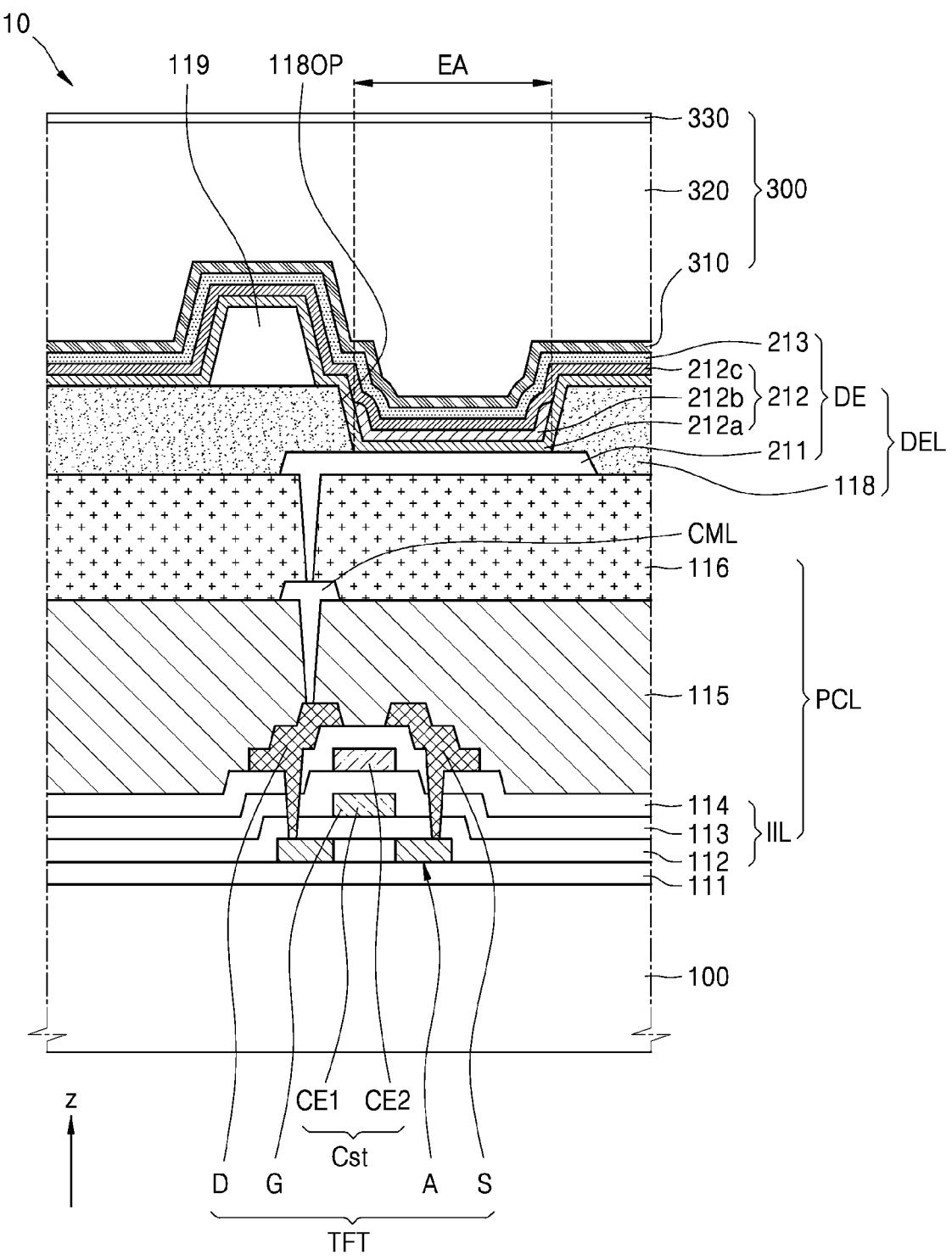
FIG. 3 is a cross-sectional view taken along line III-III' of FIG. 1, schematically illustrating a display panel according to an embodiment.

FIG. 3 is a cross-sectional view taken along line III-III' of FIG. 1, schematically illustrating the display panel 10 according to an embodiment.

Referring to FIG. 3, an embodiment of the display panel 10 may include a substrate 100, a buffer layer 111, a pixel circuit layer PCL, a display element layer DEL, and an encapsulation layer 300.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. In an embodiment, the substrate 100 may have a multi-layered structure including a base layer and a barrier layer (not shown), where the base layer includes the polymer resin described above. The substrate 100 including the polymer resin may be flexible, rollable, or bendable.

The buffer layer 111 may be disposed on the substrate 100. The buffer layer 111 may include an inorganic insulating material such as silicon nitride, silicon oxynitride, and silicon oxide, and may be defined by a single layer or a multi-layer, each layer including at least one selected from the inorganic insulating materials stated above.

The pixel circuit layer PCL may be disposed on the buffer layer 111. The pixel circuit layer PCL may include a thin-film transistor TFT included in a pixel circuit, an inorganic insulating layer IIL, a first planarization layer 115, and a second planarization layer 116, where the inorganic insulating layer IIL, the first planarization layer 115, and the second planarization layer 116 are disposed below and/or above components of the thin-film transistor TFT. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polysilicon. Alternatively, the semiconductor layer A may include an amorphous silicon, an oxide semiconductor, an organic semiconductor, or the like. The semiconductor layer A may include a channel area, a drain area, and a source area, where the drain area and the source area are respectively arranged on opposing sides of the channel area. A gate electrode G may overlap the channel area.

The gate electrode G may include a low-resistance metal material. The gate electrode G may include a conductive material including molybdenum (Mo), aluminum (Al), copper (Cu), titanium (Ti), or the like, and may be defined by a multi-layer or a single layer, each layer including at least one selected from the materials stated above.

The first gate insulating layer 112 between the semiconductor layer A and the gate electrode G may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. Here, Zinc oxide ($ZnO_x$) may be zinc oxide (ZnO), and/or zinc peroxide ($ZnO_2$).

The second gate insulating layer 113 may cover the gate electrode G. Similar to the first gate insulating layer 112, the second gate insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), or the like. Here, zinc oxide ($ZnO_x$) may be zinc oxide (ZnO), and/or zinc peroxide ($ZnO_2$).

An upper electrode CE2 of a storage capacitor Cst may be disposed on the second gate insulating layer 113. The upper electrode CE2 may overlap the gate electrode G therebelow. In such an embodiment, the gate electrode G and the upper electrode CE2, which overlap each other with the second gate insulating layer 113 therebetween, may form the storage capacitor Cst. That is, the gate electrode G may function as a lower electrode CE1 of the storage capacitor Cst. As such, the storage capacitor Cst and the thin-film transistor TFT may overlap each other. In some embodiments, the storage capacitor Cst may not overlap the thin-film transistor TFT.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be defined by a single layer or a multi-layer, each layer including at least one selected from the materials stated above.

The interlayer insulating layer 114 may cover the upper electrode CE2. The interlayer insulating layer 114 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_X$), or the like. Here, zinc oxide ($ZnO_X$) may be zinc oxide (ZnO), and/or zinc peroxide ($ZnO_2$). The interlayer insulating layer 114 may be defined by a single layer or a multi-layer, each layer including at least one selected from the inorganic insulating materials described above.

A drain electrode D and a source electrode S may each be on the interlayer insulating layer 114. The drain electrode D and the source electrode S may each include a material having good conductivity. The drain electrode D and the source electrode S may each include a conductive material including Mo, Al, Cu, Ti, or the like, and may be defined by a multi-layer or a single layer, each layer including at least one selected from the above materials. In an embodiment, the drain electrode D and the source electrode S may each have a multi-layered structure of Ti/Al/Ti.

The first planarization layer 115 may cover the drain electrode D and the source electrode S. The first planarization layer 115 may include an organic insulating layer. The first planarization layer 115 may include a general commercial polymer, such as poly(methyl methacrylate) (PMMA) or polystyrene (PS), a polymer derivative having a phenol group, or an organic insulating material, such as an acrylic polymer, an imide polymer, an aryl ether polymer, an amide polymer, a fluorine polymer, a p-xylene polymer, a vinyl alcohol polymer, or a mixture thereof.

A connection electrode CML may be disposed on the first planarization layer 115. In such an embodiment, the connection electrode CML may be connected to the drain electrode D or the source electrode S through a contact hole defined through the first planarization layer 115. The connection electrode CML may include a material having good conductivity. The connection electrode CML may include a conductive material including Mo, Al, Cu, Ti, or the like, and may be defined by a multi-layer or a single layer, each layer including at least one selected from the above materials. As an embodiment, the connection electrode CML may have a multi-layered structure of Ti/Al/Ti.

The second planarization layer 116 may cover the connection electrode CML. The second planarization layer 116 may include an organic insulating layer. The second planarization layer 116 may include a general commercial polymer, such as PMMA or PS, a polymer derivative having a phenol group, or an organic insulating material, such as an acrylic polymer, an imide polymer, an aryl ether polymer, an amide polymer, a fluorine polymer, a p-xylene polymer, a vinyl alcohol polymer, or a mixture thereof.

The display element layer DEL may be disposed on the pixel circuit layer PCL. The display element layer DEL may include a display element DE. The display element DE may be an organic light-emitting diode (OLED). A pixel electrode 211 of the display element DE may be electrically connected to the connection electrode CML through a contact hole defined through the second planarization layer 116.

In an embodiment, the pixel electrode 211 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an alternative embodiment, the pixel electrode 211 may include a reflective film including Ag, Mg, Al, Pt, Pd, Au, Ni, Nd, Ir, Cr, or a compound thereof. In another alternative embodiment, the pixel electrode 211 may further include a film including ITO, IZO, ZnO, or $In_2O_3$, which is disposed above/below the reflective film described above.

A pixel defining layer 118, in which an opening 118OP exposing a central portion of the pixel electrode 211 is defined, may be disposed on the pixel electrode 211. The pixel defining layer 118 may include an organic insulating material and/or an inorganic insulating material. The opening 118OP may define an emission area EA of light emitted from the display element DE. In an embodiment, for example, the width of the opening 118OP may correspond to the width of the emission area EA of the display element DE.

In an embodiment, the pixel defining layer 118 may include a light-blocking material, and may be provided in black. The light-blocking material may include carbon black, carbon nanotubes, a resin or paste including a black dye, metal particles, such as nickel, aluminum, molybdenum, and alloys thereof, metal oxide particles (e.g., chromium oxide), metal nitride particles (e.g., chromium nitride), or the like. In an embodiment where the pixel defining layer 118 includes a light-blocking material, reflection of external light by metal structures disposed on a lower portion of the pixel defining layer 118 may be reduced.

A spacer 119 may be disposed on the pixel defining layer 118. The spacer 119 may be configured to prevent damage to the substrate 100 in a method of manufacturing a display apparatus. In an embodiment, a mask sheet may be used when manufacturing the display panel 10. In such an embodiment, the spacer 119 may prevent a defect in which a portion of the substrate 100 is damaged by the mask sheet when the mask sheet enters the opening 118OP of the pixel defining layer 118 or closely contacts the pixel defining layer 118 to deposit a deposition material on the substrate 100.

The spacer 119 may include an organic insulating material such as polyimide. Alternatively, the spacer 119 may include an inorganic insulating material such as silicon nitride or silicon oxide, or may include an organic insulating material and an inorganic insulating material.

In an embodiment, the spacer 119 may include a material different from that of the pixel defining layer 118. In an alternative embodiment, the spacer 119 may include the same material as that of the pixel defining layer 118. In such an embodiment, the pixel defining layer 118 and the spacer 119 may be formed together in a mask operation using a halftone mask or the like.

An intermediate layer 212 may be disposed on the pixel defining layer 118. The intermediate layer 212 may include an emission layer 212b arranged in the opening 118OP of the pixel defining layer 118. The emission layer 212b may include a polymer organic material or a low-molecular-weight organic material, which emits light of a certain color.

A first functional layer 212a and a second functional layer 212c may be respectively disposed below and on the emission layer 212b. The first functional layer 212a may include, for example, a hole transport layer (HTL), or an HTL and a hole injection layer (HIL). The second functional layer 212c, as a component disposed on the emission layer 212b, may be optional. The second functional layer 212c may include an electron transport layer (ETL) and/or an electron injection layer (EIL). Similar to an opposite electrode 213 to be described below, the first functional layer 212a and/or the second functional layer 212c may be a common layer entirely covering the substrate 100.

The opposite electrode 213 may include a conductive material having a low work function. In an embodiment, for example, the opposite electrode 213 may include a (semi) transparent layer, the (semi)transparent layer including Ag, Mg, Al, Pt, Pd, Au, Ni, Nd, Ir, Cr, lithium (Li), Ca, alloys thereof, or the like. Alternatively, the opposite electrode 213 may further include a layer, such as ITO, IZO, ZnO, or $In_2O_3$, above the (semi)transparent layer including the material stated above.

In some embodiments, a capping layer (not shown) may be further disposed on the opposite electrode 213. The capping layer may include lithium fluoride (LiF), an inorganic material, or/and an organic material.

The encapsulation layer 300 may be disposed on the opposite electrode 213. In some embodiments, the encapsulation layer 300 includes at least one inorganic encapsulation layer and at least one organic encapsulation layer. FIG. 3 illustrates an embodiment where the encapsulation layer 300 includes a first inorganic encapsulation layer 310, an organic encapsulation layer 320, and a second inorganic encapsulation layer 330, which are sequentially stacked one on another.

The first inorganic encapsulation layer 310 and the second inorganic encapsulation layer 330 may each include at least one inorganic material selected from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acrylic resin, an epoxy resin, polyimide, polyethylene, or the like. In an embodiment, the organic encapsulation layer 320 may include acrylate.

Although not illustrated in FIG. 3, a touch sensor layer may be disposed on the encapsulation layer 300. The touch sensor layer may obtain coordinate information according to an external input, for example, a touch event. Hereinafter, embodiments in which the display panel 10 includes a touch sensor layer will be mainly described, but the disclosure is not limited thereto, and the touch sensor layer may be omitted.

Figure 4:
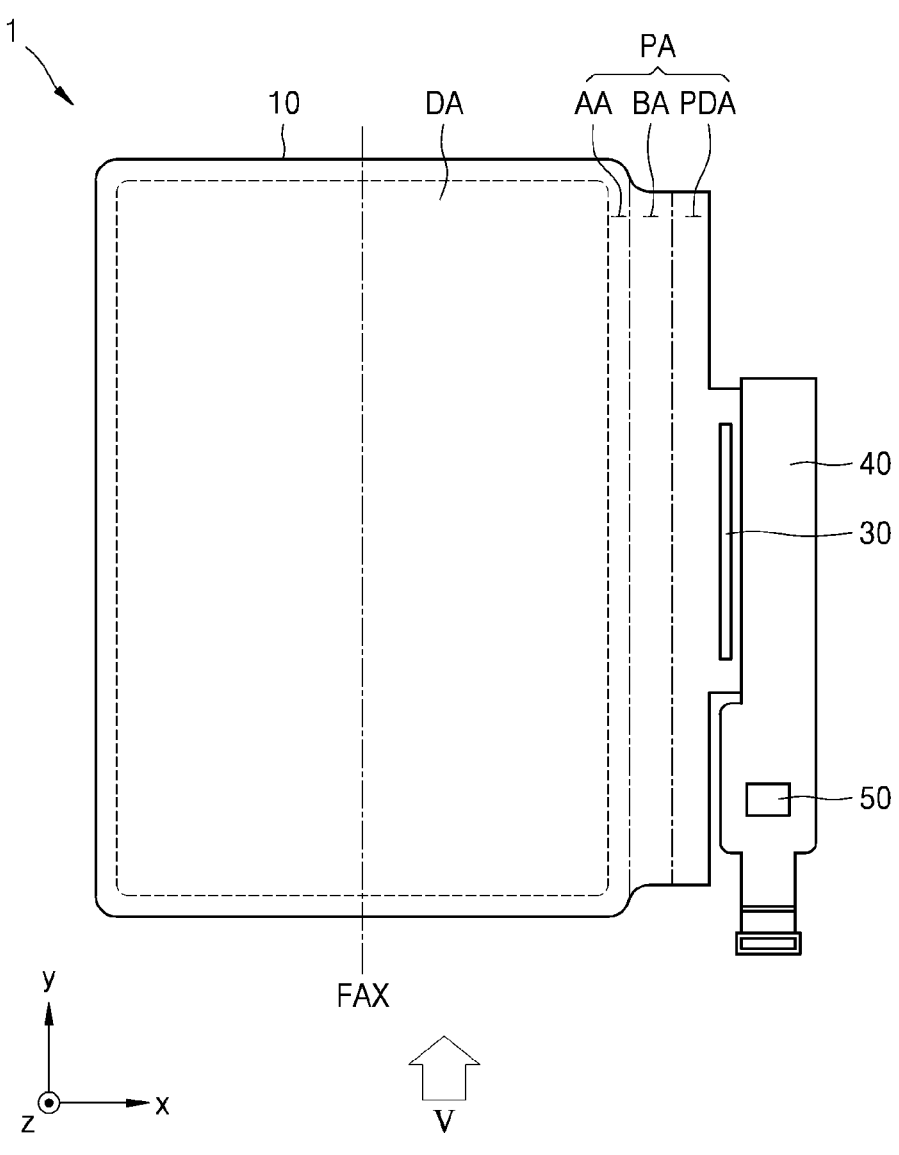
FIG. 4 is a plan view schematically illustrating a portion of a display apparatus according to an embodiment.
Figure 5:
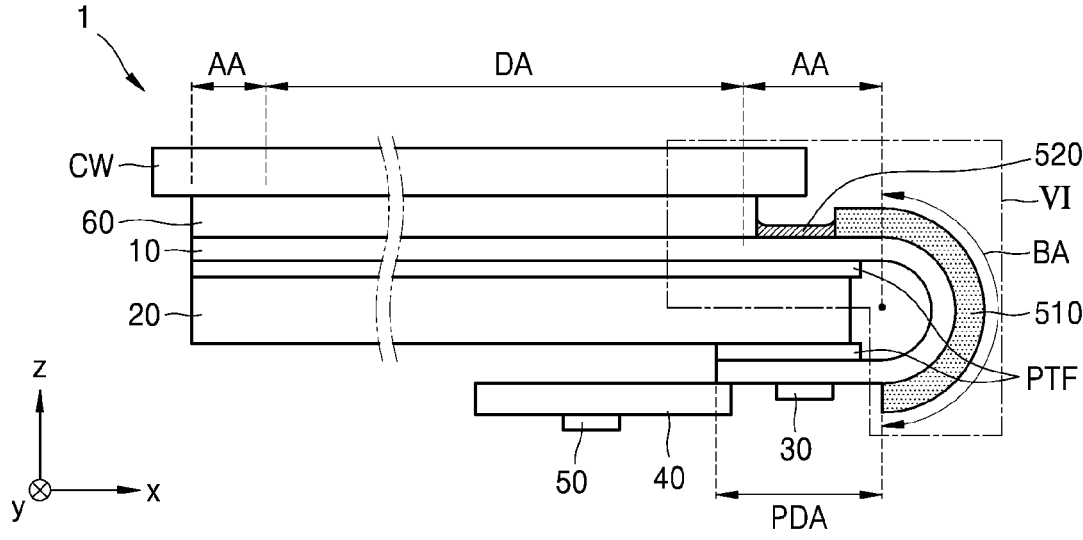
FIG. 5 is a side view schematically illustrating a display apparatus including components shown in FIG. 4.

FIG. 4 is a plan view schematically illustrating a portion of the display apparatus 1 according to an embodiment. FIG. 5 is a side view schematically illustrating the display apparatus 1 including components shown in FIG. 4. Particularly, FIG. 5 is a diagram in which the display apparatus 1 is viewed in a V direction of FIG. 4. In addition, FIG. 5 illustrates that the display panel 10 is flexible and has a shape in which the display panel 10 is bent in a bending area BA.

Referring to FIGS. 4 and 5, an embodiment of the display apparatus 1 may include the display panel 10, an optical functional layer 60, the cover window CW, a display driver 30, a display circuit board 40, a touch sensor driver 50, a cushion layer 20, a protective film PTF, a first protective member 510, and a second protective member 520.

The display panel 10 may display information processed by the display apparatus 1. In an embodiment, for example, the display panel 10 may display execution screen information of an application driven by the display apparatus 1 or user interface (UI) or graphic user interface (GUI) information according to the execution screen information.

The display panel 10 may include a display element. In an embodiment, for example, the display panel 10 may be an organic light-emitting display panel using an organic light-emitting diode (LED), a micro LED display panel using a micro LED, a quantum dot light-emitting display panel using a quantum dot LED including a quantum dot emission layer, or an inorganic light-emitting display panel using an inorganic LED including an inorganic semiconductor. Hereinafter, embodiments in which the display panel 10 is an organic light-emitting display panel using an organic LED as a display element will be mainly described in detail.

In an embodiment, as described above, the display panel 10 may include the display area DA and the peripheral area PA. The peripheral area PA may include an adjacent area AA being adjacent to the display area DA and surrounding the display area DA, the bending area BA which extends from one side of the adjacent area AA and may be bent, and a pad area PDA connected to the bending area BA and in which drivers configured to apply scan signals or data signals may be arranged.

In an embodiment, the bending area BA may extend from a side of the adjacent area AA surrounding the display area DA, where the side is not passed through by the folding axis FAX. In an embodiment, for example, as shown in FIG. 4, the bending area BA may extend from a side of the adjacent area AA in an x direction. In such an embodiment, the bending area BA may be arranged to be spaced apart from the folding axis FAX in a first direction (e.g., the x direction of FIG. 4).

The display panel 10 may be bent in the bending area BA. In an embodiment, at least some of lower surfaces of the display panel 10 may face each other, and the pad area PDA of the display panel 10 may be positioned lower (the −z direction of FIG. 5) than other portions of the display panel 10. Accordingly, the area of the peripheral area PA recognized by a user may be reduced.

The optical functional layer 60 may be disposed on the display panel 10. The optical functional layer 60 may reduce the reflectance of light (external light) incident from the outside toward the display apparatus 1, and/or improve color purity of light emitted from the display apparatus 1. In an embodiment, the optical functional layer 60 may include a retarder and/or a polarizer. The retarder may be a film type or a liquid-crystal coating type, and may include a λ/2 retarder and/or a λ/4 retarder. The polarizer may also be a film type or a liquid-crystal coating type. The film-type polarizer may include a stretch-type synthetic resin film, and the liquid-crystal-coating-type polarizer may include liquid crystals in a certain arrangement. The retarder and the polarizer may further include a protective film.

The cover window CW may be disposed on the optical functional layer 60. The cover window CW may protect the display panel 10 and the optical functional layer 60. In an embodiment, the cover window CW may be a flexible window. The cover window CW may protect the display panel 10 and the optical functional layer 60 while being easily bent by an external force without occurrence of cracks or the like. The cover window CW may include at least one selected from glass, sapphire, and plastic. The cover window CW may be, for example, ultra-thin glass (UTG) or colorless polyimide. In an embodiment, the cover window CW may have a structure in which a flexible polymer layer is disposed on one surface of a glass substrate, or may only include a polymer layer.

The cover window CW may be attached to the optical functional layer 60 by an adhesive layer (not shown). The adhesive layer may be a pressure sensitive adhesive (PSA). The adhesive layer may be provided or formed on the optical functional layer 60 through various methods, for example, being formed in the form of a film and attached to an upper portion of the optical functional layer 60, being formed in the form of a resin and coated on the upper portion of the optical functional layer 60, or the like.

The display driver 30 may be arranged in the pad area PDA. The display driver 30 may receive control signals and power voltages, and generate and output signals and power voltages for driving the display panel 10. The display driver 30 may include an integrated circuit (IC).

The display circuit board 40 may be electrically connected to the display panel 10. In an embodiment, for example, the display circuit board 40 may be in contact with and connected to the pad area PDA of the display panel 10, or may be electrically connected to the pad area PDA by an anisotropic conductive film.

The display circuit board 40 may be a flexible printed circuit board (FPCB) or a rigid printed circuit board (RPCB). Alternatively, in some cases, the display circuit board 40 may be a composite printed circuit board including both an FPCB and an RPCB.

In an embodiment, the touch sensor driver 50 may be disposed on the display circuit board 40. The touch sensor driver 50 may include an IC. The touch sensor driver 50 may be attached on the display circuit board 40. The touch sensor driver 50 may be electrically connected to sensor electrodes in a touch sensor layer of the display panel 10 through the display circuit board 40.

In an embodiment, a power supply unit may be further disposed above the display circuit board 40. The power supply unit may supply a driving voltage for driving pixels of the display panel 10 and the display driver 30.

In an embodiment, the protective film PTF may be patterned and attached to a lower surface of the display panel 10. in such an embodiment, the protective film PTF may be attached to a portion of the display panel 10, the portion excluding the bending area BA. As the display panel 10 is bent in the bending area BA, a portion of the protective film PTF and another portion of the protective film PTF may be arranged to face each other.

In an embodiment, the cushion layer 20 may be arranged between the portion and the other portion of the protective film PTF. The cushion layer 20 may absorb an external shock to prevent the display panel 10 from being damaged. The cushion layer 20 may include a polymer resin such as polyurethane, polycarbonate, polypropylene, polyethylene, or the like, or may include an elastic material such as rubber, a sponge formed by foam-molding a urethane material or an acrylic material, or the like.

The first protective member 510 may be arranged in the bending area BA of the display panel 10. In an embodiment, the first protective member 510 may be arranged to be spaced apart from the optical functional layer 60 in a first direction (e.g., x direction of FIG. 5). Accordingly, a gap may be formed between the optical functional layer 60 and the first protective member 510, and the second protective member 520 may be arranged to fill the gap. The first protective member 510 and the second protective member 520 may protect the display panel 10, in particular, the bending area BA and the adjacent area AA adjacent to the bending area BA, from external shock and electrostatic discharge (ESD). In the display panel 10, a plurality of signal lines may be arranged in the adjacent area AA, the bending area BA, and the pad area PDA, and each of the plurality of signal lines may face the display circuit board 40. In such an embodiment, the plurality of signal lines may be damaged due to ESD generated from the outside. Here, ESD is a phenomenon in which a charged object and another object having a potential difference from that of the charged object come into contact with each other to cause a charge transfer in a short moment. A leakage current due to ESD may cause malfunctions or defects of the display panel 10 and the display circuit board 40. According to an embodiment, ESD may be effectively prevented through the second protective member 520.

Figure 6:
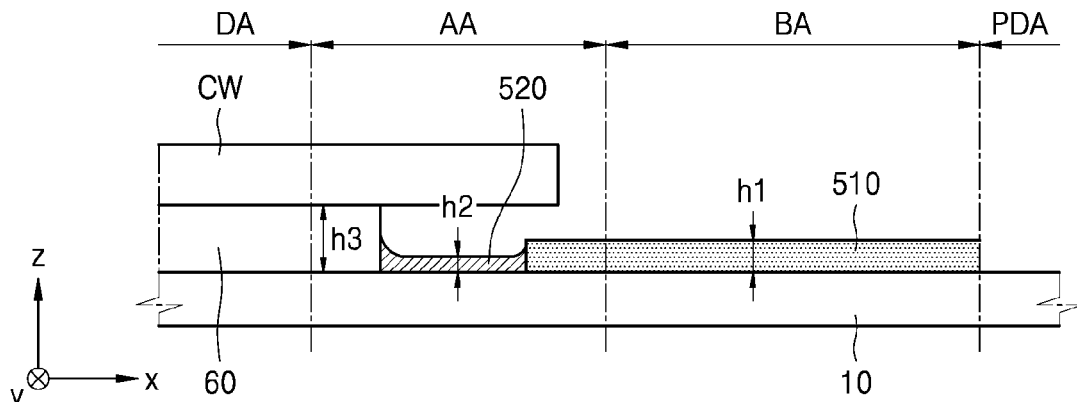
FIG. 6 is an enlarged view of a region VI of FIG. 5, schematically illustrating a display apparatus according to an embodiment.

FIG. 6 is an enlarged view of a region VI of FIG. 5, schematically illustrating a display apparatus according to an embodiment. FIG. 6 illustrates the bending area BA in an unfolded state without being bent, for convenience of illustration and description.

Referring to FIG. 6, as described above, the display panel 10 may include a multi-layered structure in which the pixel circuit layer PCL (refer to FIG. 3), the display element layer DEL (refer to FIG. 3), and the encapsulation layer 300 (refer to FIG. 3) are disposed on the substrate 100 (refer to FIG. 3). In an embodiment, a touch sensor layer may be disposed above the encapsulation layer 300. Here, embodiments in which the display apparatus 1 is the display apparatus 1 which is foldable and has a folding axis as described above will be mainly described, but the disclosure is not limited thereto, and the disclosure may also be applied in a case where the display apparatus 1 is a display apparatus that does not have a folding axis.

The optical functional layer 60 may be disposed on the display panel 10. In an embodiment, the optical functional layer 60 may be disposed on the display panel 10 to correspond to the display area DA. The optical functional layer 60 being disposed to correspond to the display area DA may mean that the optical functional layer 60 is arranged in the display area DA, but the disclosure is not limited thereto, and may mean that the optical functional layer 60 may also be arranged in a portion of the adjacent area AA as well as the display area DA. Hereinafter, for convenience of description, embodiments in which the optical functional layer 60 is also arranged in a portion of the adjacent area AA will be mainly described.

The first protective member 510 may be disposed on the display panel 10 to correspond to the bending area BA. The first protective member 510 being disposed to correspond to the bending area BA may mean that the first protective member 510 is arranged in the bending area BA, but the disclosure is not limited thereto, and may mean that the first protective member 510 may also be arranged in a portion of the adjacent area AA as well as the bending area BA. Hereinafter, for convenience of description, embodiments in which the first protective member 510 is arranged in a portion of the adjacent area AA will be mainly described.

The first protective member 510 may protect the bending area BA. In an embodiment, the first protective member 510 may be disposed on a surface of the display panel 10, for example, directly on a same surface as a surface on which the optical functional layer 60 is disposed directly, to cover the bending area BA. In an embodiment, an end portion of the first protective member 510 may extend from the bending area BA to the adjacent area AA adjacent to the bending area BA to cover the display panel 10, and another end portion of the first protective member 510 may extend from the bending area BA to the pad area PDA to cover the display panel 10. In an embodiment, the first protective member 510 may include a photo-curable resin. The first protective member 510 may protect the bending area BA against external impact and relieve stress in the bending area BA. In addition, the position of a neutral plane may be adjusted to minimize the stress applied to the bending area BA by arranging the first protective member 510 on the display panel 10, especially bending area BA.

In such an embodiment, the first protective member 510 may be arranged to be spaced apart from the optical functional layer 60 in a first direction (e.g., the x direction of FIG. 6). The first direction in which the first protective member 510 is spaced apart from the optical functional layer 60 may be the same direction as a direction from the display area DA toward the bending area BA. Accordingly, a gap may be formed between the first protective member 510 and the optical functional layer 60. The gap may correspond to a distance of the adjacent area AA in the first direction, when the optical functional layer 60 is arranged in the display area DA and the first protective member 510 is arranged in the bending area BA. Alternatively, the gap may be less than a distance of the adjacent area AA in the first direction, when the optical functional layer 60 is also arranged in a portion of the adjacent area AA and the first protective member 510 is also arranged in a portion of the adjacent area AA.

The gap between the optical functional layer 60 and the first protective member 510 may be particularly desired to be provided in a foldable display apparatus. That is, in general, in the case of an unfolding display apparatus that is not folded around a folding axis on the display area DA, the optical functional layer 60 and the first protective member 510 may be arranged to be in contact with each other, that is, the optical functional layer 60 and the first protective member 510 may be arranged not to have a gap therebetween. However, in the case of the display apparatus 1, which is foldable, in particular, the display apparatus 1 (refer to FIG. 1) that is folded around the folding axis FAX crossing the display area DA and extending in, for example, a second direction (a y direction of FIG. 6), layers stacked on a substrate while being in-folded around the folding axis FAX, in particular, the optical functional layer 60, may be pushed in the first direction (an x direction of FIG. 6) and slip away. In this case, when the optical functional layer 60 and the first protective member 510 are arranged to be in contact with each other as in a non-folding display apparatus, the first protective member 510 may be pressed in the first direction due to the slip of the optical functional layer 60, and accordingly, the first protective member 510 or the optical functional layer 60 may be detached from the display panel 10, or the display panel 10 may be damaged such that defects may occur in the display panel 10 and the display apparatus 1.

Accordingly, in an embodiment, the optical functional layer 60 and the first protective member 510 may be spaced apart from each other to form a gap therebetween. Accordingly, even when the optical functional layer 60 is pushed in the first direction by folding the display apparatus 1, the first protective member 510 may not be pressed, thereby effectively preventing the display apparatus 1 from being damaged.

In an embodiment, the second protective member 520 may be arranged to fill a gap between the optical functional layer 60 and the first protective member 510. The second protective member 520 may shield an upper surface (a surface in a +z direction of FIG. 6) of the display panel 10 in the gap to prevent the display panel 10 from being damaged as ESD is generated in the gap.

In such an embodiment, the second protective member 520 may include a material having a low modulus. In an embodiment, for example, the modulus of the second protective member 520 may be about 10 megapascals (MPa) or greater and less than about 80 MPa, in particular, about 30 MPa, at a low temperature (−20° C.). Table 1 shows evaluation results regarding a low-temperature operating life (LTOL) and ESD, according to various embodiments 520-1,

520-2, and 520-3 of the second protective member 520, where different modulus at a low temperature (−20° C.) are used in the various embodiments. Referring to Table 1, when the modulus of the second protective member 520 is about 80 MPa or greater at a low temperature (−20° C.), lifting may occur in the evaluation on LTOL, and thus, the display panel 10 may be damaged.

TABLE 1

| Second protective member | 520-1 | 520-2 | 520-3 |
|---|---|---|---|
| Modulus at low temperature (−20° C.) | 54 MPa | 30 MPa | 80 MPa |
| Evaluation on LTOL | Pass | Pass | Occurrence of lifting |
| Evaluation on ESD | Pass | Pass | Pass |

In an embodiment, the modulus of the second protective member 520 may be less than the modulus of the first protective member 510. As described above, the modulus of the second protective member 520 may be about 10 MPa or greater and less than about 80 MPa, in particular, about 30 MPa, at a low temperature (−20° C.). The modulus of the first protective member 510 may be about 800 MPa or more and less than about 1300 MPa at a low temperature (−20° C.).

In an embodiment, the modulus of the second protective member 520 may be greater than about 0 MPa and less than about 25 MPa, e.g., greater than about 0 MPa and less than about 1 MPa, ore may be about 0.02 MPa, at a room temperature (25° C.). The modulus of the first protective member 510 may be about 150 MPa or greater and less than about 300 MPa at the room temperature (25° C.).

In such an embodiment, where the modulus of the second protective member 520 has a low modulus which is much less than the modulus of the first protective member 510, interference with the optical functional layer 60 may be minimized even when the display panel 10 is in-folded around a folding axis. That is, because the second protective member 520 has a relatively very small modulus, even when the optical functional layer 60 presses the second protective member 520 in the first direction (x direction of FIG. 6), the second protective member may behave fluidly with a small repulsive force such that the optical functional layer 60 may not be detached from the display panel 10. In addition, the second protective member 520 also contacts the first protective member 510 but has a very small modulus, and thus, damage to the display panel 10, such as detachment of the first protective member 510 from the display panel 10 by pressing the first protective member 510, may be prevented, as in the case of the optical functional layer 60. In such an embodiment, because the first protective member 510 has a greater modulus than that of the second protective member 520, that is, a relatively large modulus, the first protective member 510 may be suitable for dispersing stress in the bending area BA and protecting the bending area BA.

In a case, where only the first protective member 510 is arranged to contact the optical functional layer 60 without providing the second protective member 520 therebetween, the display panel 10 may be damaged due to the slip of the optical functional layer 60. In a case, where only the second protective member 520 is arranged from the optical functional layer 60 to the bending area BA without providing the first protective member 510, because the modulus of the second protective member 520 is low, the bending area BA may not be effectively protected.

In an embodiment, as described above, the second protective member 520 having the above properties may effectively prevent ESD. In such an embodiment, the display panel 10 may not be damaged even at a threshold value 4 to 7 times greater than a threshold value generally allowed for ESD.

In an embodiment, the viscosity of the second protective member 520 may be less than the viscosity of the first protective member 510. In an embodiment, for example, the viscosity of the second protective member 520 may be about 50 centipoise (cps) or greater and less than about 1000 cps. The viscosity of the first protective member 510 may be about 1000 cps or greater. As such, because the viscosity of the second protective member 520 is relatively low, a repulsive force may be small and fluidly behave.

In an embodiment, the second protective member 520 may include a resin having silicon (Si) as a base. However, the disclosure is not limited thereto, and may include a resin such as an epoxy resin or the like, without departing from the teachings herein.

Referring back to FIG. 6, the second protective member 520 may be formed by using the optical functional layer 60 as a dam to be coated on the display panel 10. Accordingly, the second protective member 520 may have a shape having a thickness h2 which is greater at a side adjacent to the optical functional layer 60 than at a center.

In an embodiment, the thickness h2 of the second protective member 520 may be less than a thickness h3 of the optical functional layer 60 such that an adhesive layer (not shown) which may be disposed on an upper portion (e.g., +z direction of FIG. 6) of the optical functional layer 60 and/or the cover window CW may be effectively prevented from interfering with the second protective member 520.

In such an embodiment, the thickness h2 of the second protective member 520 may be a minimum thickness for shielding ESD, for example, about 20 micrometers (μm) or greater. This may be a thickness corresponding to ¼ or greater of the thickness h3 of the optical functional layer 60 in an embodiment. Accordingly, the thickness h2 of the second protective member 520 may be ¼ or greater and less than 4/4 of the thickness h3 of the optical functional layer 60.

In an embodiment, the second protective member 520 may be formed by using the first protective member 510 as a dam to be coated on the display panel 10 on a side opposite to the optical functional layer 60. Accordingly, the second protective member 520 may have a shape having the thickness h2 which is greater at a side adjacent to the first protective member 510 than at a center.

In an embodiment, where the second protective member 520 is arranged by using the first protective member 510 as a dam, the thickness h2 having a minimum value, which is at a point where the thickness of the second protective member 520 is the smallest, may be less than the thickness h1 having a minimum value, which is at a point where the thickness of the first protective member 510 is the smallest. The first protective member 510 has to maintain a certain degree of modulus and thickness to protect the bending area BA and to disperse stress. In contrast, the second protective member 520 may be formed to have a thickness for preventing ESD, and for convenience in manufacturing, the second protective member 520 may be formed to have a thickness less than the thickness of each of the optical functional layer 60 and the first protective member 510 to be coated on the display panel 10 by using each of the optical functional layer 60 and the first protective member 510 as a dam.

In an embodiment, the thickness h1 of the first protective member 510 may be less than the thickness h3 of the optical functional layer 60 to prevent an adhesive layer (not shown) which may be disposed on an upper portion (e.g., +z direction of FIG. 6) of the optical functional layer 60 and/or the cover window CW from interfering with the first protective member 510 when the adhesive layer and/or the cover window CW extends beyond the display area DA to the adjacent area AA and/or the bending area BA. Because the modulus of the first protective member 510 is greater than the modulus of the second protective member 520, that is, a relatively large modulus, the thickness h1 of the first protective member 510 may be relatively small. In a case, where the first protective member 510 is replaced with the second protective member 520 having a small modulus, the thickness of the second protective member 520 may be desired to be sufficiently great to protect the bending area BA, and may interfere with the cover window CW.

In an embodiment of the display apparatus 1 as described above, the second protective member 520 may not overlap the optical functional layer 60 in a plan view (that is, when the display apparatus 1 is viewed in a −z direction of FIG. 6). In such an embodiment, the second protective member 520 may not overlap the first protective member 510. In such an embodiment, because the thickness h2 of the second protective member 520 is less than the thickness h3 of the optical functional layer 60, the entirety or a portion of the second protective member 520 may overlap the cover window CW disposed on the upper portion of the optical functional layer 60. Because the thickness h1 of the first protective member 510 is also less than the thickness h3 of the optical functional layer 60, the entirety or a portion of the first protective member 510 may overlap the cover window CW.

Figure 7:
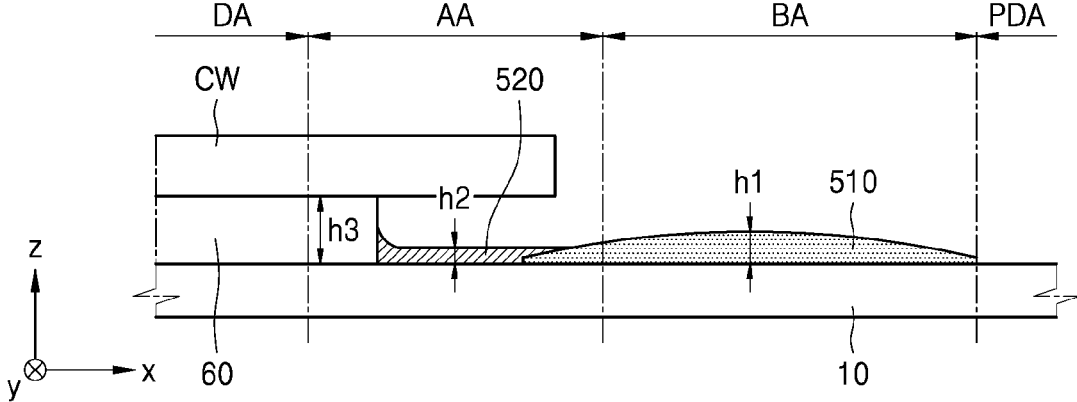
FIG. 7 is a side view schematically illustrating a display apparatus according to an embodiment.

FIG. 7 is a side view schematically illustrating a display apparatus according to an alternative embodiment, and is corresponding to FIG. 6. Hereinafter, for convenience of description, features of the display apparatus of FIG. 7 different from those of the display apparatus 1 described above will be mainly described.

Referring to FIG. 7, in a plan view, a portion of the second protective member 520 may overlap a portion of the first protective member 510. In such an embodiment, a portion of the second protective member 520 may be disposed on an upper portion (+z direction of FIG. 7) of a portion of the first protective member 510. In an embodiment, the thickness h1 of the first protective member 510 may increase from both end portions to the center thereof in a first direction (x direction of FIG. 7). As will be described below, the first protective member 510 may be a resin and may have a shape according to the coating of the resin on the display panel 10.

In such an embodiment, as described above, the second protective member 520 may be formed by using the first protective member 510 as a dam to be coated on the display panel 10 from a side (e.g., a side in the x direction of FIG. 7). The thickness h1 of the first protective member 510 at opposing end portions thereof in the first direction may be less than the thickness h2 of the second protective member 520. The thickness h1 having a maximum value at a point where the thickness h1 of the first protective member 510 is the greatest (e.g., a thickness at the center of the first protective member 510 in the first direction) may be greater than the thickness h2 of the second protective member 520.

Figure 8:
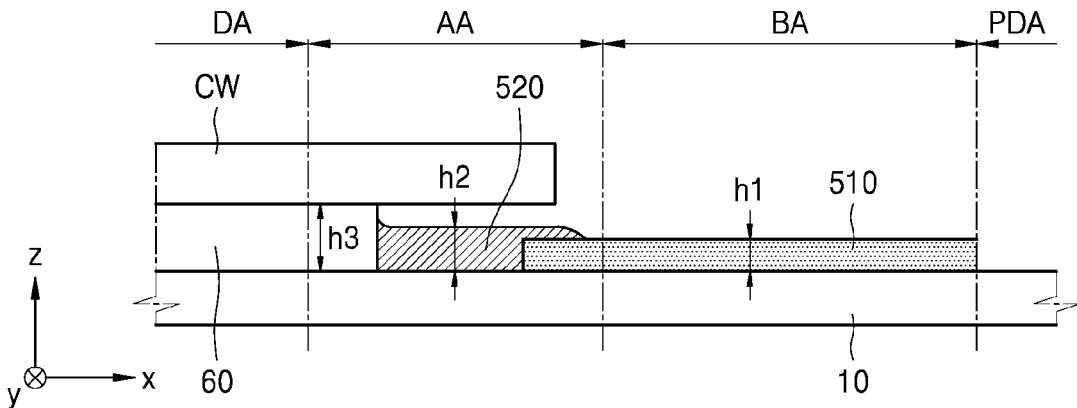
FIG. 8 is a side view schematically illustrating a display apparatus according to an embodiment.

FIG. 8 is a side view schematically illustrating a display apparatus according to another alternative embodiment, and is corresponding to FIG. 6. Hereinafter, for convenience of description, features of the display apparatus of FIG. 8 different from those of the display apparatus 1 described above will be mainly described.

Referring to FIG. 8, similar to the display apparatus of FIG. 7, in a plan view, a portion of the second protective member 520 may overlap a portion of the first protective member 510. In such an embodiment, a portion of the second protective member 520 may be disposed on an upper portion (+z direction of FIG. 8) of a portion of the first protective member 510.

In such an embodiment, the second protective member 520 may not be coated by using the first protective member 510 as a dam. That is, the second protective member 520 may fill a gap between the optical functional layer 60 and the first protective member 510, and may be arranged to cover a portion of the first protective member 510. Accordingly, the thickness h2 of the second protective member 520 may be greater than the thickness h1 of the first protective member 510.

Figure 9:
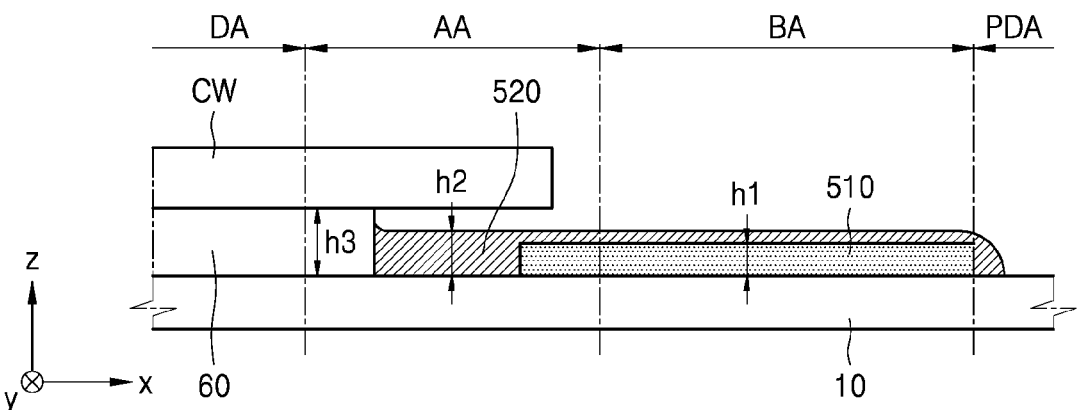
FIG. 9 is a side view schematically illustrating a display apparatus according to an embodiment.

FIG. 9 is a side view illustrating a display apparatus according to another alternative embodiment, and is corresponding to FIG. 6. Hereinafter, for convenience of description, features of the display apparatus of FIG. 9 different from those of the display apparatus 1 described above will be mainly described.

Referring to FIG. 9, the second protective member 520 may entirely cover the first protective member 510. In such an embodiment, a portion of the second protective member 520 may be disposed on an upper portion (+z direction of FIG. 9) of the entire first protective member 510. In addition, in a plan view, the entire first protective member 510 may overlap the second protective member 520. In such an embodiment, in a plan view, the first protective member 510 may be arranged inside the periphery of the second protective member 520. Accordingly, the thickness h2 of the second protective member 520 may be greater than the thickness h1 of the first protective member 510. In such an embodiment, the second protective member 520 may cover the first protective member 510 and may be integrally formed from the adjacent area AA to the bending area BA and/or to a portion of the pad area PDA. Accordingly, as compared to a case where the first protective member 510 is not completely covered by the second protective member 520, the second protective member 520 may continuously appear smooth and may form a continuous surface. In addition, the second protective member 520 may completely cover the first protective member 510 to reinforce that the first protective member 510 protects the bending area BA.

FIGS. 10 to 15 are diagrams schematically illustrating a method of manufacturing a display apparatus according to an embodiment. The method of manufacturing a display apparatus according to an embodiment may be a method of manufacturing an embodiment of the display apparatus, but is not limited thereto.

Figure 10:
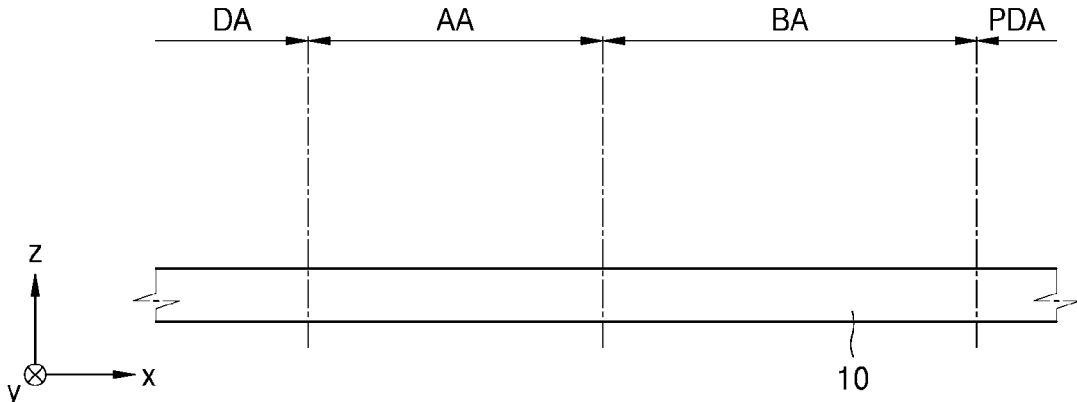
FIGS. 10 to 15 are diagrams schematically illustrating a method of manufacturing a display apparatus according to an embodiment.

Referring to FIG. 10, a side view of the display panel 10 is shown. As described above, the display panel 10 may include the display area DA, the adjacent area AA adjacent to the display area DA, the bending area BA connected to the adjacent area AA, and the pad area PDA connected to the bending area BA.

Figure 11:
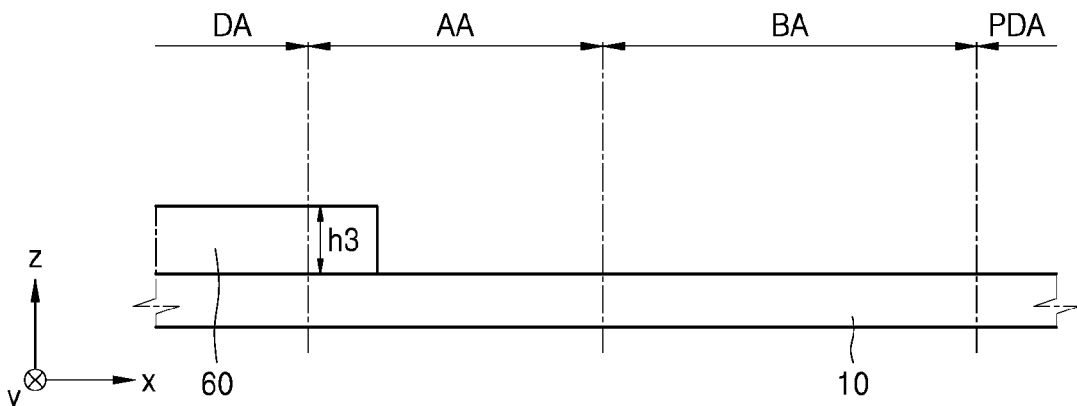

Referring to FIG. 11, the optical functional layer 60 may be provided or formed on the display panel 10. The optical functional layer 60 may be arranged to correspond to the display area DA. In such an embodiment, a portion of the optical functional layer 60 may also be arranged in the adjacent area AA.

Figure 12:
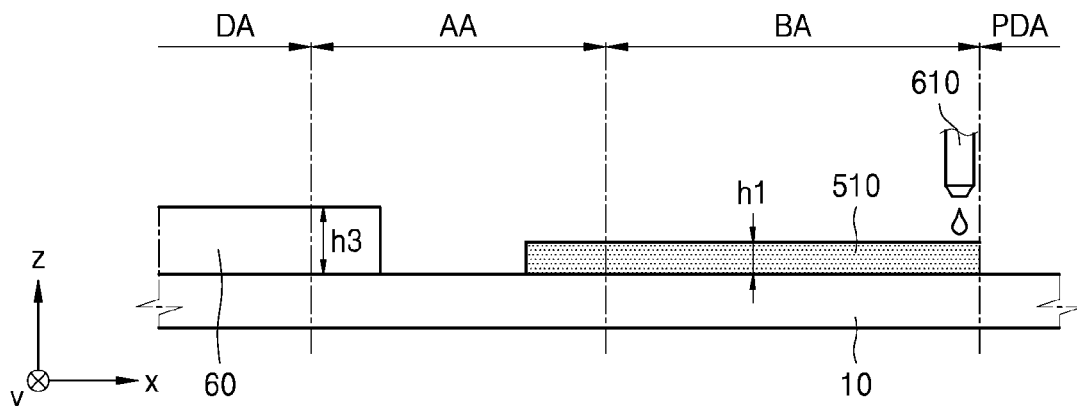

Referring to FIG. 12, the first protective member 510 may be provided or formed on the display panel 10. In an embodiment, the first protective member 510 is in the form of a resin, and may be coated on the display panel 10 by a nozzle 610. The nozzle 610 may coat the first protective member 510 by moving in a first direction (an x direction of FIG. 12) and a second direction (a y direction of FIG. 12) crossing the first direction and discharging droplets. In such an embodiment, the first protective member 510 may be coated to correspond to the bending area BA. Accordingly, the first protective member 510 may be arranged to be spaced apart from the optical functional layer 60 in the first direction (the x direction of FIG. 12). As described above, the first protective member 510 may be coated to have the thickness h1 to be less than the thickness h3 of the optical functional layer 60. In addition, depending on a method of coating the first protective member 510, the thickness h1 of the first protective member 510 may be substantially constant as shown in FIG. 6 or may decrease toward both end portions of the first protective member 510 in the first direction as shown in FIG. 7.

Figure 13:
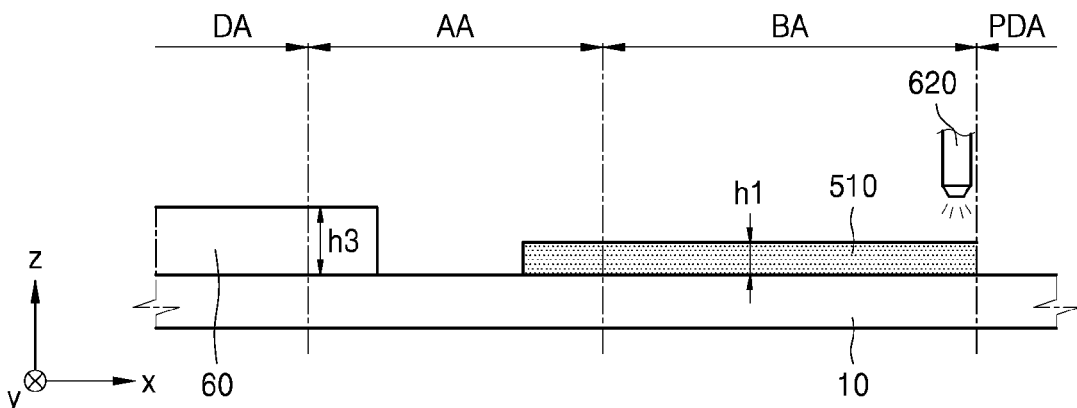

Referring to FIG. 13, the first protective member 510, which is coated, may be cured. In an embodiment, the first protective member 510 may include a photo-curable resin and may be cured by a curing member 620. The curing member 620 may include a light-emitting member, such as an LED module, for example, to radiate ultraviolet rays. The curing member 620 may radiate ultraviolet rays while moving in a first direction (an x direction of FIG. 13) and a second direction (a y direction of FIG. 13) crossing the first direction.

Figure 14:
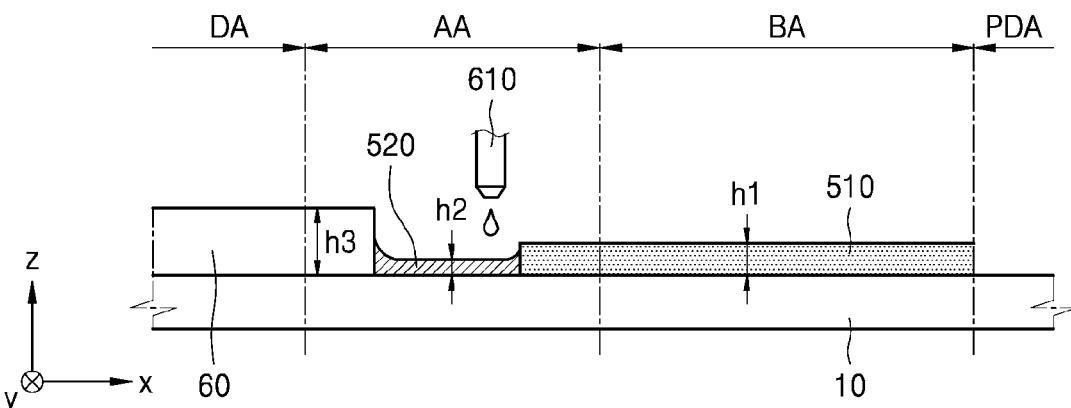

Referring to FIG. 14, the second protective member 520 may be provided or formed to fill a gap between the optical functional layer 60 and the first protective member 510. In an embodiment, the second protective member 520 may be in the form of a resin, and may be coated on the display panel 10 by the nozzle 610. The nozzle 610 may coat the second protective member 520 while moving in a first direction (an x direction of FIG. 14) and a second direction (a y direction of FIG. 14) crossing the first direction. In an embodiment, the second protective member 520 may be coated by using each of the optical functional layer 60 and the first protective member 510 as a dam. Accordingly, the thickness h2 of the second protective member 520 may be less than each of the thickness h1 of the first protective member 510 and the thickness h3 of the optical functional layer 60. However, the second protective member 520 is not limited to the coating as shown in FIG. 14, and the second protective member 520 may be coated to partially overlap the first protective member 510 in a plan view, or may be coated by using the optical functional layer 60 as a dam and coated without using the first protective member 510 as a dam, as shown in FIG. 8. Alternatively, the second protective member 520 may be coated to entirely cover the first protective member 510, as shown in FIG. 9. In an embodiment where the second protective member 520 is coated as shown in FIGS. 8 and 9, the thickness h2 of the second protective member 520 may be greater than the thickness h1 of the first protective member 510.

Figure 15:
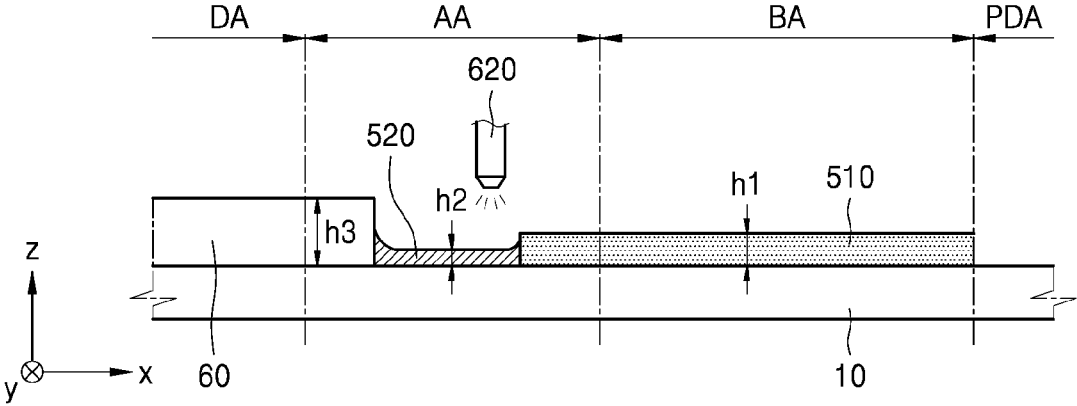

Referring to FIG. 15, the second protective member 520, which is coated, may be cured. In an embodiment, similar to the first protective member 510, the second protective member 520 may include a photo-curable resin and may be cured by the curing member 620. The curing member 620 may include a light-emitting member, such as an LED module, for example, to radiate ultraviolet rays. The curing member 620 may radiate ultraviolet rays while moving in a first direction (an x direction of FIG. 15) and a second direction (a y direction of FIG. 15) crossing the first direction. After the second protective member 520 is cured, the bending area BA of the display panel 10 may be bent as shown in FIG. 5. In addition, the display apparatus 1 may be manufactured by disposing the cover window CW on the optical functional layer 60.

According to embodiments, a second protective member may be arranged to cover an open area of a display panel to prevent ESD of the display panel. In such an embodiment, because the second protective member has a low modulus, damage to the display panel due to interference with other layers may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a display panel comprising a display area, an adjacent area surrounding the display area, and a bending area extending from one side of the adjacent area;
an optical functional layer disposed on the display panel;
a first protective member disposed in the bending area and spaced apart from the optical functional layer in a first direction from the display area toward the bending area; and
a second protective member disposed to fill a gap between the optical functional layer and the first protective member,
wherein a modulus of the second protective member is less than a modulus of the first protective member.

2. The display apparatus of claim 1, wherein the modulus of the second protective member is about 10 MPa or greater and less than about 80 MPa at −20° C.

3. The display apparatus of claim 1, wherein the modulus of the second protective member is greater than about 0 MPa and less than about 1 MPa at 25° C.

4. The display apparatus of claim 1, wherein the second protective member comprises a resin including silicon (Si).

5. The display apparatus of claim 1, wherein a viscosity of the second protective member is about 50 cps or greater and less than about 1,000 cps.

6. The display apparatus of claim 1, wherein, in a plan view, the second protective member is in contact with the optical functional layer without overlapping the optical functional layer.

7. The display apparatus of claim 6, wherein, in a plan view, the second protective member is in contact with the first protective member without overlapping the first protective member.

8. The display apparatus of claim 6, wherein a thickness of the second protective member is less than a thickness of the optical functional layer.

9. The display apparatus of claim 8, wherein the thickness of the second protective member is ¼ or greater and less than 4/4 of the thickness of the optical functional layer.

10. The display apparatus of claim 1, wherein a thickness of the first protective member is less than a thickness of the optical functional layer.

11. The display apparatus of claim 10, wherein, in a plan view, a portion of the first protective member overlaps a cover window disposed on the optical functional layer.

12. The display apparatus of claim 1, wherein, in a plan view, the second protective member overlaps a portion of the first protective member.

13. The display apparatus of claim 12, wherein a thickness of the second protective member is less than a maximum thickness of the first protective member.

14. The display apparatus of claim 1, wherein the second protective member completely covers the first protective member.

15. The display apparatus of claim 1, wherein the display apparatus is foldable around a folding axis extending in a second direction crossing the first direction,
the bending area is spaced apart from the folding axis in the first direction, and,
the optical functional layer is configured to press the second protective member in the first direction when the display apparatus is folded.

16. A method of manufacturing a display apparatus, the method comprising:
preparing a display panel comprising a display area, an adjacent area surrounding the display area, and a bending area extending from one side of the adjacent area;
providing an optical functional layer on the display panel;
providing a first protective member in the bending area to be spaced apart from the optical functional layer; and
providing a second protective member to fill a gap between the optical functional layer and the first protective member,
wherein a modulus of the second protective member is less than a modulus of the first protective member.

17. The method of claim 16, wherein the modulus of the second protective member is about 10 MPa or greater and less than about 80 MPa at −20° C.

18. The method of claim 16, wherein the modulus of the second protective member is greater than about 0 MPa and less than about 1 MPa at 25° C.

19. The method of claim 16, wherein the second protective member comprises a resin including silicon (Si).

20. The method of claim 16, wherein a viscosity of the second protective member is about 50 cps or greater and less than about 1,000 cps.

21. The method of claim 16, wherein the providing the second protective member comprises providing the second protective member by using the optical functional layer as a dam in a way such that the second protective member does not overlap the optical functional layer in a plan view.

22. The method of claim 21, wherein the providing the second protective member comprises providing the second protective member to have a thickness that is less than a thickness of the optical functional layer.

23. The method of claim 22, wherein the thickness of the second protective member is ¼ or greater and less than 4/4 of the thickness of the optical functional layer.

24. The method of claim 16, wherein the providing the second protective member comprises providing the second protective member to completely cover the first protective member.

25. The method of claim 16, wherein the providing the second protective member comprises:
coating the second protective member through a nozzle; and
curing the second protective member by radiating ultraviolet rays.

26. The method of claim 16, wherein the providing the f protective member comprises:

coating the first protective member through a nozzle; and curing the first protective member by radiating ultraviolet rays.

* * * * *